United States Patent [19]
Kefalas

[11] Patent Number: 5,241,277
[45] Date of Patent: Aug. 31, 1993

[54] TEST SYSTEM FOR AUTOMATIC TESTING OF INSULATION RESISTANCE, CAPACITANCE AND ATTENUATION OF EACH CONTACT PAIR IN A FILTER PIN CONNECTOR

[75] Inventor: Nicholas D. Kefalas, Milford, Conn.

[73] Assignee: United Technologies Corporation, Hartford, Conn.

[21] Appl. No.: 843,498

[22] Filed: Feb. 28, 1992

[51] Int. Cl.$^5$ .......................................... G01R 31/04
[52] U.S. Cl. .................................. 324/538; 324/158 F
[58] Field of Search ............... 324/538, 539, 540, 541, 324/158 F

[56] References Cited

U.S. PATENT DOCUMENTS 5,097,213  3/1992  Hunting et al. ........................ 324/538

OTHER PUBLICATIONS

Military Standard 2120, MIL-STD-2120, entitled Connectors, Electromagnetic Interference (EMI) Filter Contact, U.S. Dept. of Defense, 27 Aug. 1984, Section 5.2.6.1, p. 7.

Primary Examiner—Walter E. Snow
Attorney, Agent, or Firm—Michael Grillo

[57] ABSTRACT

An automated test system for testing a filter pin connector (320) uses an insulation resistance tester (102) for testing the filter pin connector insulation resistance, a capacitance meter (104) for measuring the capacitance of each filter pin connector pin contact pair (10), a signal generator (100), and a radio frequency (RF) microvoltmeter for measuring the pin contact pair attenuation of test signals provided by the signal generator. A test fixture includes a pair of RF multiplexers (112, 113) and a high voltage multiplexer (115) for providing a signal path between each pin contact pair and the test equipment. A microprocessor (120) controls the test equipment and multiplexers for measuring the insulation resistance, capacitance, and signal attenuation of each pin contact pair.

13 Claims, 4 Drawing Sheets

TEST SYSTEM FOR AUTOMATIC TESTING OF INSULATION RESISTANCE, CAPACITANCE AND ATTENUATION OF EACH CONTACT PAIR IN A FILTER PIN CONNECTOR

TECHNICAL FIELD

The present invention relates to automated test systems and more particularly to an automated test system for measuring filter pin connector capacitance, insulation resistance, and high frequency attenuation.

BACKGROUND OF THE INVENTION

Filter pin connectors provide an economical way to filter electromagnetic interference (EMI) and radio frequency interference (RFI) along signal paths between electronic equipment. For example, a low-pass filter may be built into each filter pin connector pin contact so that the filter pin connector passes D.C. and low-frequency AC signals while attenuating high frequencies. There are several types of filter pin connectors, each having a different circuit design depending on its intended use, e.g., L-type, L-C type, T-section, pi-section, etc., each named for their schematic diagram.

Long unshielded cable runs are particularly susceptible to interference, and therefore it may be necessary to provide electrical filters as an integral part of a connector in such a cable run to suppress EMI and RFI. Additionally, if the electronic equipment is intended for use in an environment contaminated with a high degree of EMI and RFI, e.g., electronic equipment used in aircraft, it may be necessary to provide filter pin connectors in the cable runs to allow proper operation of the equipment. In addition to protecting electronic equipment against EMI and RFI, filter pin connectors are used to protect equipment against electrical power surges that result from electrostatic discharges caused, for example, by a lightning strike. Filter pin connectors are particularly useful in telecommunications systems, data processing and microprocessor based systems, motor vehicles and aircraft.

Typically, only high potential voltage (Hipot) testing is conducted on filter pin connectors during manufacture. Hipot testing is conducted by placing connector pin contacts under a high potential voltage, and measuring the insulation resistance and monitoring for insulation resistance breakdown. However, Hipot testing will not identify malfunctioning of the connector's attenuation characteristics or capacitance values.

Manual bench tests may be performed on filter pin connectors to measure for continuity between corresponding pin contacts using a digital volt meter (DVM), and to verify proper capacitance range using a capacitance meter. However, bench tests of these types only serve as preliminary test procedures and provide only limited information with respect to the proper operation or type of malfunction of the filter pin connector under test. Additionally, such manual tests are very time-consuming to perform, particularly on a connector having numerous pin contacts to be tested.

A problem associated with filter pin connectors is that a failure in the connector's signal attenuation characteristics is very difficult to discover, both prior to and after installation into a system. Once the filter pin connector is installed in a system, a failure of the connector is virtually indistinguishable from other types of failures in the signal path. *Military Standard* 2120, MIL-STD-2120, Aug. 27, 1984, Section 5.2.6.1 discusses a manual test procedure for performing attenuation testing of a filter pin connector. The manual test requires RF probes to be connected between pin contacts on one side of the filter pin connector and a signal generator, and between pin contacts on the other side of the filter pin connector and a RF microvoltmeter. The probes and signal generator must be capable of operating in a frequency range between 10 Mhz and 1 Ghz. All of the equipment used for the test requires calibration before any measurements are taken. The test must be repeated for each pin contact of the filter pin connector under test, and the test equipment requires re-calibration between each test because movement of the test probes affects the response of the test equipment to the test signals provided by the signal generator, especially at high frequencies, i.e., 200 Mhz to 1 Ghz. Therefore, a manual attenuation test of this type is extremely time-consuming and costly, and may be highly susceptible to interference and noise resulting in high error values and potentially making the test results un-repeatable and inconclusive.

DISCLOSURE OF INVENTION

Objects of the present invention include provision of an automated test system for filter pin connectors which provides rapid and accurate measurements of filter pin connector insulation resistance, capacitance and high frequency attenuation.

According to the present invention, automated testing of filter pin connector insulation resistance, capacitance and attenuation is provided by mounting the connector on a test fixture which provides an interface between the connector and test instrumentation; a microprocessor controls the test fixture and the test instrumentation for measuring insulation resistance, capacitance or high frequency attenuation of filter pin connector pin contacts; and the response of each filter pin connector pin contact to the testing is provided to the microprocessor as an indication of filter pin connector insulation resistance, capacitance or attenuation.

In further accord with the present invention, the test fixture is provided with a universal interface for interconnection with a plurality of types of filter pin connectors, the microprocessor being responsive to a command signal indicative of the type of filter pin connector installed on the test fixture for providing test signals to the pin contacts of the connector under test, the microprocessor further being responsive to a command signal for controlling the test fixture and instrumentation to perform any one or combination of the insulation resistance, capacitance or attenuation tests on the connector.

In still further accord with the present invention, the test fixture and test instrumentation is automatically calibrated prior to providing any test signals to, or making any measurements on, a filter pin connector to ensure repeatability of the test results and to minimize error in the test results.

The automated test system of the present invention provides rapid and reliable verification of the proper operation of a filter pin connector under test. A universal test fixture allows the system to be used for testing a variety of different types of filter pin connectors. Additionally, the operator of the test system may select which tests are performed on the filter pin connector depending on the particular operating characteristics of the connector. The test fixture is calibrated prior to testing a connector to ensure the repeatability of the measured values and to minimize the error in the test results. The test fixture is not required to be re-calibrated between tests of individual filter pin connector pin contacts. Separate cabling is provided between the test instrumentation and each pin contact, and therefore each signal path between the test instrumentation and connector pin contacts may be individually calibrated. After a connector is installed for testing, there is no change in the test fixture configuration.

The present invention represents a significant advance over prior methods of testing filter pin connectors. The error in the testing of the connector is significantly reduced and additionally, automated testing of a connector takes much less time than a manual test.

The foregoing and other objects, features and advantages of the present invention will become more apparent in light of the following detailed description of exemplary embodiments thereof, as illustrated in the accompanying drawings.

BEST MODE FOR CARRYING OUT THE INVENTION

The automated test system of the present invention is particularly well-suited for providing rapid and accurate measurements of filter pin connector insulation resistance, capacitance and high frequency attenuation. The system is adapted for testing a variety of different types of filter pin connectors including cylindrical filter pin connectors of various diameters such as the cylindrical filter pin connector shown in FIG. 1, and rectangular filter pin connectors such as the rectangular filter pin connector shown in FIG. 2.

Figure 1:
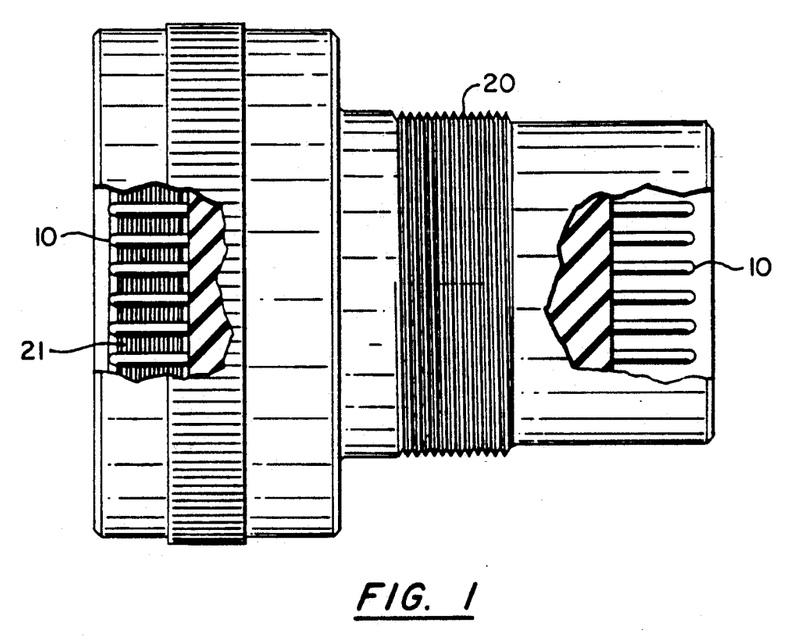
FIG. 1 is a perspective view, partially broken away, of a cylindrical filter pin connector which may be tested using the system of the present invention.
Figure 2:
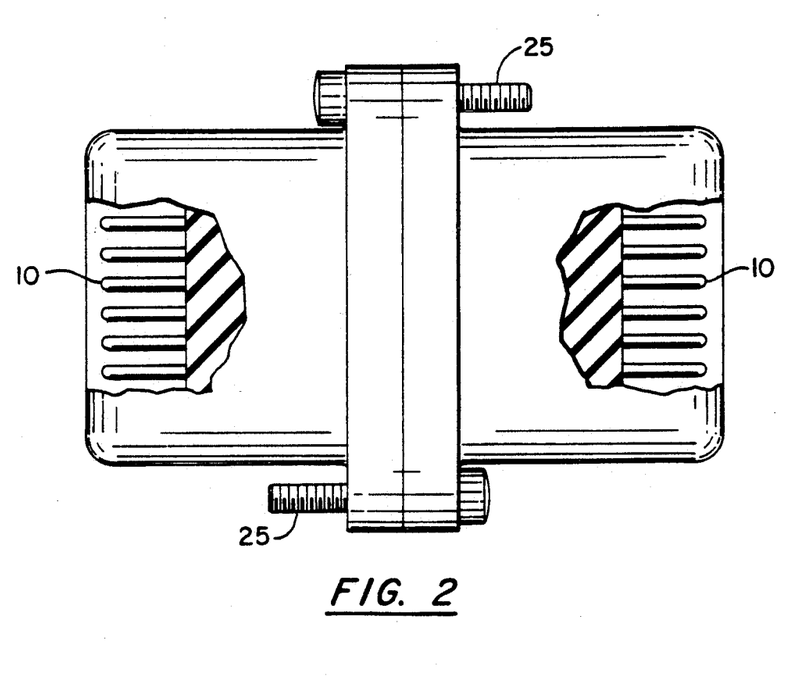
FIG. 2 is a perspective view, partially broken away, of a rectangular filter pin connector which may be tested using the system of the present invention.

Referring to FIGS. 1 and 2, each filter pin connector comprises one or more pairs of pin contacts 10 which provide a signal path from one side of the connector to the other. Each pin path contains filter network circuitry (not shown) for filtering the signals that pass therethrough. The filter circuitry includes various components, e.g., capacitors, resistors, inductors, etc., in a configuration for providing the desired filtering characteristics. Typically, a cylindrical filter pin connector will possess fastening means, e.g., threads 20,21, for interlocking engagement with other cylindrical connectors in a system. Rectangular connectors are also provided with fastening means 25 for interlocking engagement with other rectangular connectors of a system.

Figure 3:
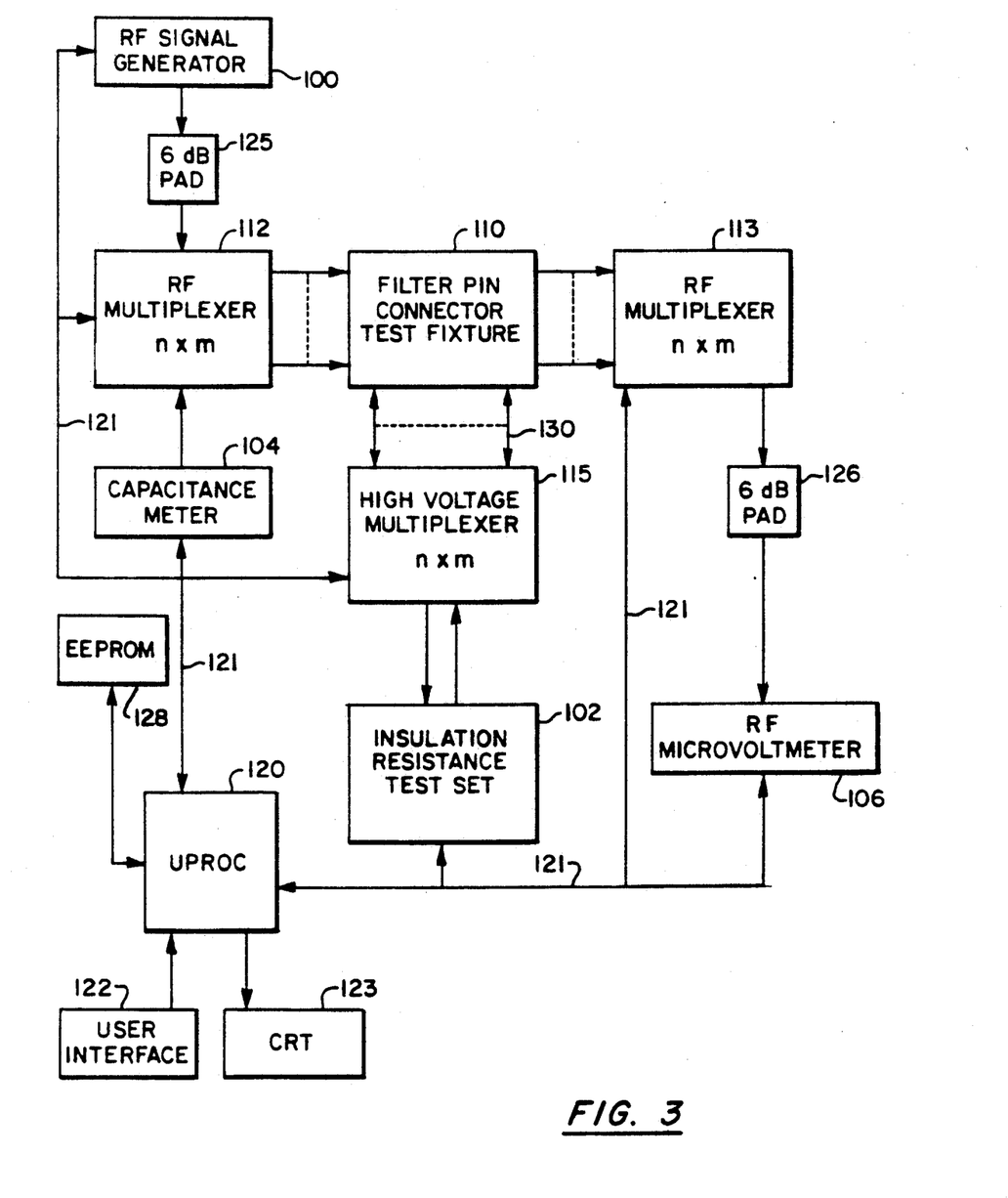
FIG. 3 is a schematic block diagram of the automated test system of the present invention.

Referring to FIG. 3, the automated test system of the present invention consists of four major instruments: an RF signal generator 100, a high voltage insulation resistance tester 102, a capacitance meter 104, and a RF microvoltmeter 106. The instrumentation is interfaced to a test fixture 110 through a pair of n by m RF relay module multiplexers 112, 113, and a n by m high voltage relay module multiplexer 115. The n and m values of the multiplexers 112, 113, 115 are selected to provide a sufficient number of signal paths for testing connectors having numerous pin contacts. The test fixture 110 is configured for mounting a variety of types of filter pin connectors, and will be described in greater detail with respect to FIG. 5.

The test system is provided with a microprocessor 120 for controlling the operation of the test instrumentation and the multiplexers. A computer interface bus 121 interconnects the microprocessor with the test instrumentation and the multiplexers. The microprocessor may be of any type which is able to interface with the test instrumentation and multiplexers over a standard computer interface bus, e.g., a Hewlett Packard HP-9000 series computer using a standard RS-232, IEEE-488 interface bus.

A user interface 122, e.g., a data entry key-pad, is used to provide a connector signal to the microprocessor indicative of the type of filter pin connector being tested. The interface 122 is also used to supply command signals to the microprocessor for controlling which tests are performed on the filter pin connector. A display 123, e.g., a CRT, is provided for displaying the test results.

Attenuation testing of filter pin connectors is done in accordance with MIL-STD-2120. During attenuation testing, the microprocessor 120 controls the system to provide a signal path from the RF signal generator 100 via a 6 dB isolation pad 125 and one of the RF relay module multiplexers 112 to the test fixture 110. The test fixture 110 provides signals to the filter pin connector to be tested, and the output of the filter pin connector is provided to the RF microvoltmeter 106 via the other RF relay module multiplexer 115 and a 6 dB isolation pad 126. The RF signal generator 100 must be capable of +/− 20 dB amplifications and attenuations, and a frequency spectrum of 10 Mhz to 1 Ghz, e.g., a Hewlett Packard HP-8642B signal generator. Additionally, the RF relay module multiplexers 112, 113 must be capable of handling frequencies above 1 Ghz with attenuation levels of less than 0.5 dB. The 6 dB isolation pads 125, 126 are provided to limit the power delivered to the test fixture 110 and the RF microvoltmeter 106 if the signal generator 100 is overdriven.

The test system must be calibrated prior to performing any attenuation measurements. This is accomplished by first providing the microprocessor with a connector type signal, via the user interface 122, indicative of the type of filter pin connector to be tested. The microprocessor uses a look-up table stored in a non-volatile memory 128, e.g., an EEPROM, to determine the corresponding multiplexer relay modules which will be used to provide a signal path through the filter pin connector. The test fixture 110 is configured to provide a direct signal path from the applicable multiplexer relay modules 112 on the signal generator side of the test fixture to the multiplexer relay modules 113 on the RF microvoltmeter side of the test fixture. The microprocessor then individually activates each signal path which corresponds to the configuration of the filter pin connector by activating pairs of relay modules while isolating all of the other relay modules to thereby provide a signal path for RF signals. The RF signal generator 100 is activated by the microprocessor 120 to transmit a 100 Mhz signal at +20 dB through each of the signal paths. The RF microvoltmeter 106 measures the equivalent dB value through each signal path and provides the value to the microprocessor 120. The difference between the signal provided by the RF signal generator and the signal measured by the RF microvoltmeter is the calibration factor for that signal path, and reflects the overall system and cable losses through that signal path. This test is repeated for each pin path which correspond to the configuration of the filter pin connector to be tested.

Once the calibration is complete, the filter pin connector is mounted on the test fixture. The microprocessor 120 then controls the RF signal generator 100 and the RF relay module multiplexers 112, 113 to provide test signals to corresponding pairs of filter pin connector pin contacts. The microprocessor 120 controls the RF signal generator 100 to test each pair of pin contacts at 10 Mhz, 100 Mhz, and 1 Ghz. For each frequency, the microprocessor individually activates each connector pin path of the filter pin connector to verify that each pin path is attenuating properly. Each attenuation measurement made by the RF microvoltmeter 106 is provided to the microprocessor 120, which subtracts the calibration factor from the measured value, thereby providing an attenuation measurement that is indicative of the actual attenuation by the filter pin connector. All attenuation measurement values are stored by the microprocessor.

Capacitance testing is conducted in a similar manner to attenuation testing. The capacitance meter 104 is connected to the test fixture via one of the RF relay module multiplexers 112. All capacitance measurements for a filter pin connector are made from each of the pin contacts to the shell of the connector. During capacitance testing, the filter pin connector is initially not mounted in the test fixture 110. Instead, the microprocessor 120 activates the capacitance meter 104 to calibrate each of the paths between the test fixture and the meter. This is done so that any stray capacitance that exists in a signal path, e.g., through the multiplexer relay modules, coaxial cables and test fixture pin contacts, is taken into account and removed from the actual measured capacitive value.

During calibration, the microprocessor 120 selects each signal path by activating the correct multiplexer signal path while isolating all others. The capacitance meter 104 measure the capacitance value, which is indicative of the stray capacitance in the path between the selected pin contact and the meter. The capacitance measurements are stored by the microprocessor. The calibration routine is conducted only on those paths corresponding to the configuration of the filter pin connector to be tested. Once all of the signal paths have been tested, the accumulated values are averaged, establishing a mean error value which is stored by the microprocessor.

Upon completion of calibration, the filter pin connector is installed on the test fixture for capacitance measurements. Each pin contact of the filter pin connector is thereafter tested by activating the correct multiplexer path while isolating all others. The measured results for each path are provided to the microprocessor, which removes the recorded stray capacitance values for that path from the recorded results to thereby supply a capacitance value indicative of the actual capacitance of the corresponding filter pin connector pin contact. Measurements are repeated for every pin contact of the filter pin connector to thereby verify that all capacitors are of the correct value and properly installed. All measured values are stored by the microprocessor.

Insulation resistance measurements are conducted to verify that the filter pin connector has proper resistance values between pins and between pins and the shell. Typically, the resistance values are in the 3 to 4 Giga Ohm scale. The insulation resistance tester 102 is interfaced to the test fixture 110 via the high voltage relay module multiplexer 115. The high voltage multiplexer is connected to the test fixture via high voltage wires 130. The high voltage relays in the high voltage relay module multiplexer are rated at 1 kilovolt.

No calibration procedure is required prior to testing the filter pin connector insulation resistance. The filter pin connector is simply mounted on the test fixture. The microprocessor disables all relay modules except for those associated with the high voltage multiplexer 115. Thereafter, the microprocessor controls the high voltage relay modules by activating pairs of relay modules to test the pin-to-pin insulation resistance and the pin-to-shell insulation resistance. All measured values are provided to, and stored by, the microprocessor.

In addition to providing the microprocessor with information related to the number of filter pin connector pin contacts and the filter pin connector type, i.e., cylindrical, rectangular, etc., the user interface may also be used to provide the microprocessor with information related to the circuitry contained in the filter pin connector pin paths. For each filter pin connector circuit design, the memory 128 stores a table which lists the corresponding test which should be performed on the connector, and the expected values of the test results. The CRT provides a display of all test results; however, the CRT can be controlled to display only those results that differ from the expected values within the given tolerances.

Figure 4:
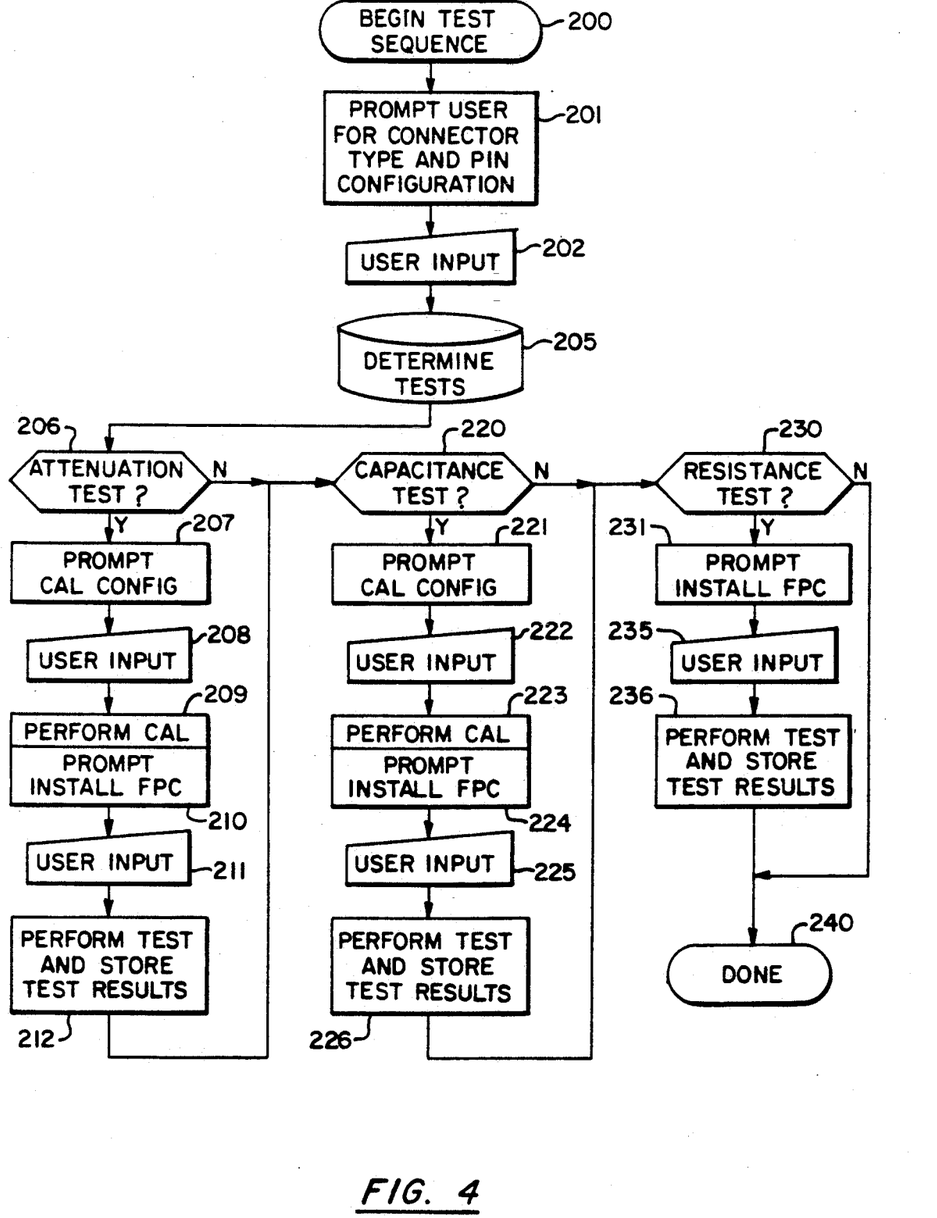
FIG. 4 is a simplified logic flow diagram of an interactive routine executed by a microprocessor of the system for performing filter pin connector testing.

The microprocessor is provided with an interactive routine of the type shown in FIG. 4 which utilized the CRT and the user interface for performing filter pin connector testing. The routine requests the uses to supply information related to the type of filter pin connector to be tested, e.g., connector type, number of pins and pin configuration, schematic diagram, etc., and thereafter the routine directs the user through a step by step procedure for perform the tests.

Referring to FIG. 4, the subroutine test sequence begins in a step 200, and the microprocessor performs a step 201 wherein the the user is prompted to provide information related to the type of filter pin connector to be tested. The microprocessor then receives the information in a step 202 from the user interface. The steps 201 and 202 may require only one interaction wherein the user inputs the manufacturer's identifying information about the connector to be tested, or it may involve a series of steps wherein the user is requested to provide the connector type, number of pins, pin configuration, schematic diagram, etc.

Next, the microprocessor performs a subroutine 205 wherein it determines the test procedure to be used in testing the filter pin connector designated in step 202. The subroutine of step 205 may consist of a look-up table which cross-references the designated connector to a specific test sequence.

Once the appropriate tests and configuration are determined, the microprocessor checks if attenuation testing should be performed in a test 206. If the results of the test 206 are positive, a step 207 is performed wherein the user is prompted to configure the test fixture for attenuation calibration, and to indicate that the configuration is complete using the user interface. The user indicates that the test fixture has been configured for attenuation calibration in a step 208, and then the microprocessor performs a step 209 wherein the attenuation calibration is performed. The microprocessor next performs a step 210 wherein the user is prompted to install the filter pin connector for attenuation testing, and to indicate that the connector is installed using the user interface. The user indicates that the connector is installed in a step 211, and then the microprocessor performs a step 212 wherein the attenuation test is performed and the test results are stored.

If the results of the test 206 are negative, or after completion of the step 212, the microprocessor checks if capacitance testing should be performed in a test 220. If the results of the test 220 are positive, a step 221 is performed wherein the user is prompted to configure the test fixture for capacitance calibration, and to indicate that the configuration is complete using the user interface. The user indicates that the test fixture has been configured for capacitance calibration in a step 222, and then the microprocessor performs a step 223 wherein the capacitance calibration is performed. The microprocessor next performs a step 224 wherein the user is prompted to install the filter pin connector for capacitance testing, and to indicate that the connector is installed using the user interface. The user indicates that the connector is installed in a step 225, and then the microprocessor performs a step 226 wherein the capacitance test is performed and the test results are stored.

If the results of the test 220 are negative, or after completion of the step 226, the microprocessor checks if insulation resistance testing should be performed in a test 230. If the results of the test 230 are positive, a step 231 is performed wherein the user is prompted to install the filter pin connector for insulation resistance testing, and to indicate that the connector is installed using the user interface. The user indicates that the connector is installed in a step 235, and then the microprocessor performs a step 236 wherein the insulation resistance test is performed and the test results are stored.

If the results of the test 230 are negative, or after completion of the step 236, the microprocessor returns in a step 240.

Figure 5:
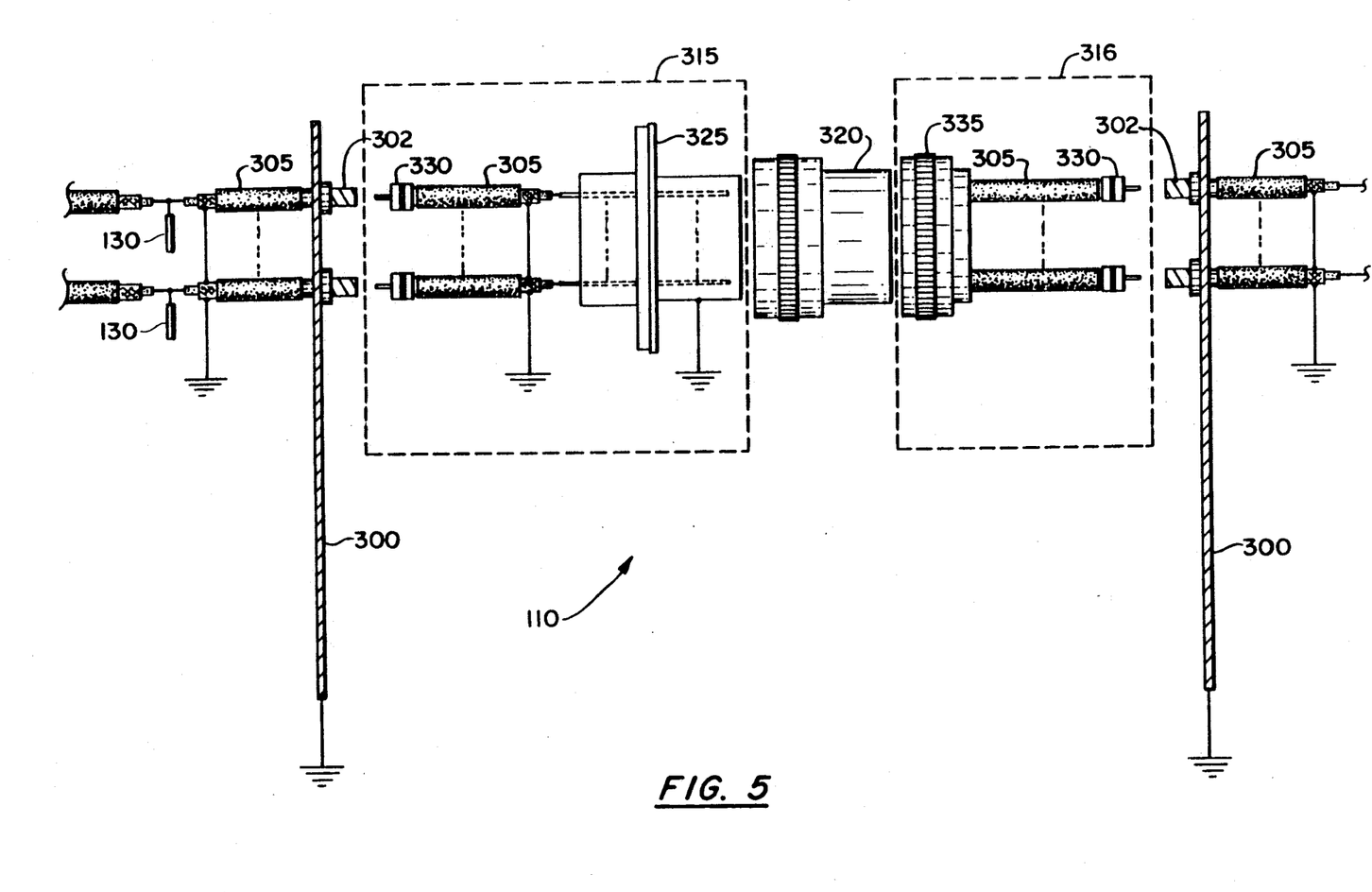
FIG. 5 is a schematic diagram of the automated test system test fixture with a cylindrical filter pin connector mounted for testing.

Referring to FIG. 5, the test fixture 110 is built around a mounting structure 300, e.g., metal mounting plates, for supporting a plurality of RF coaxial cable end connectors 302, e.g., male SMA connectors. RF coaxial cable 305 is connected between each of the end connectors 302 and each RF multiplexer relay module. Therefore, the test fixture comprises a first mounting plate having a plurality of RF coaxial end connectors interconnected to the multiplexer relay modules on the RF signal generator side of the test fixture, and a second mounting plate having a plurality of RF coaxial cable end connectors interconnected to the multiplexer relay modules on the RF microvoltmeter side of the test fixture. Between the RF multiplexer 112 on the signal generator side of the test fixture and the test fixture 110, high voltage heavy gage wire 130 is soldered to the center wire of each RF coaxial cable 305. The other end of the heavy gage wire 130 is connected to each relay module of the high voltage multiplexer 115.

A pair of adaptor cables 315, 316 are provided for mounting a filter pin connector 320 in the test fixture 110. A first adaptor cable 315 provides an interface between the RF signal generator side of the test fixture and the filter pin connector, and a second adaptor cable 316 provides an interface between the RF microvoltmeter side of the test fixture and the filter pin connector. The first adaptor cable comprises an end connector 325 having the same configuration as the filter pin connector 320 for mating engagement with the filter pin connector. A RF coaxial cable 305 is mounted at one end to each of the connector's pin contacts. The opposing end of each of the RF coaxial cables 305 has a RF coaxial cable connector 330 mounted thereon, e.g., a female SMA connector. The RF coaxial cable connectors 330 are configured for engagement with the RF coaxial cable end connectors 302 mounted on the mounting plates 300.

The second adaptor cable 316 also comprises an end connector 335 configured for engagement with the filter pin connector 320. Each of the pin contacts of the end connector 335 has a RF coaxial cable mounted thereto, the opposing end of the RF coaxial cable having an RF coaxial cable connector 330, e.g., a female SMA connector, for engagement with the RF coaxial cable end connectors 302 mounted on the mounting plate 300.

It will therefore be understood by those skilled in the art that a different pair of adaptor cables must be supplied for each type of filter pin connector to be tested. The number of RF coaxial cables provided with each adaptor cable will depend on the number of pin contacts in the filter pin connector to be tested. When the adaptor cables are mounted in the test fixture, each of the adaptor RF coaxial cables must be properly connected to the corresponding test fixture RF coaxial cable end connector 302. Each of the RF coaxial cable end connectors corresponds to one of the multiplexer relay modules, and therefore it is important that the correct connections are made so that when the microprocessor controls the multiplexer relay modules, signals are provided to the appropriate filter pin connector pin contacts.

During capacitance testing and insulation resistance testing, only the first adaptor cable 315 is used. For capacitance testing, the first adaptor cable is installed, and then the capacitance calibration measurements are performed. Thereafter, the filter pin connector 320 is mounted on the connector 325, and capacitance measurements are taken. For insulation resistance testing, the filter pin connector 320 is mounted on the first adaptor cable connector 325, and the insulation resistance tests are performed.

Both the first and second adaptor cables are required to perform attenuation testing. For attenuation testing calibration, the first and second adaptor cables 315, 316 are connected to the mounting plate 300, and then the adaptor cable connectors 325, 335 are directly interconnected to provide a signal path therethrough. If the first and second adaptor cable connectors are not configured to be mounted together, a dummy filter pin connector (not shown) may be installed to provide a signal path therethrough. When attenuation testing calibration is completed, the filter pin connector 320 to be tested is installed between the adaptor cable connectors 325, 335, and the test is performed.

Although the invetion is described as being used to test rectangular and cylincrical filter pin connectors, it will be understood by those skilled in the art that any filter pin connector may be tested using the system of the present invention. All that is required to properly test a filter pin connector is that the appropriate adapter cables 315,316 be configured for providing test signals to, and makeing measurements on the filter pin connetor being tested.

The invention is described as using a computer subroutine and a look-up table for instructing the user on the individual steps to perform when testing a filter pin connector; however, the invention would would equally as well if the test procedures for various types of filter pin connectors are provided in a written manual or guide which instructs the user on the steps to perform to test the filter pin connector.

Although the invention has been shown and described with respect to exemplary embodiments thereof, it should be understood by those skilled in the art that the foregoing and other changes, omissions and additions may be made therein and thereto, without departing from the spirit and scope of the present invention.

I claim:

1. An automated test system for testing a filter pin connector having at least one pin contact pair, each pin contact pair having filter circuitry for filtering signals which pass therethrough, the test system measuring filter pin connector insulation resistance with high voltage test signals provided by a high voltage (HV) insulation resistance tester, measuring the capacitance of each pin contact pair with a capacitance meter, and measuring each pin contact pair attenuation of signal generator test signals with a radio frequency (RF) microvoltmeter, comprising:

first RF multiplexer means having a plurality of first RF relay modules connected to the capacitance meter and the signal generator for providing a signal path from the capacitance meter and the signal generator to one pin contact in each pin contact pair;

second RF multiplexer means having a plurality of second RF relay modules connected to the RF microvoltmeter for providing a signal path from the other pin contact in each pin contact pair to the RF microvoltmeter;

HV multiplexer means having a plurality of HV relay modules connected to the HV insulation resistance tester for providing a signal path from the HV insulation resistance tester to the one pin contact in each pin contact pair;

user interface means for providing a connector type signal indicative of the type of filter pin connector to be tested, for providing an attenuation calibration signal indicative of the test system being in a configuration for attenuation calibration, for providing an attenuation test signal indicative of the test system being in a configuration for performing attenuation testing of each pin contact pair, for providing a capacitance calibration signal indicative of the test system being in a configuration for capacitance calibration, for providing a capacitance test signal indicative of the test system being in a configuration for performing capacitance measurements of each pin contact pair, and for providing an insulation resistance test signal indicative of the test system being in a configuration for insulation resistance testing; and signal processing means responsive to said connector type signal for determining which ones of said first and second RF relay modules and said HV relay modules are required to provide a test signal path to each pin contact pair, responsive to said attenuation calibration signal for controlling said first and second RF relay modules, the signal generator and the RF microvoltmeter to individually perform attenuation calibration measurements of each test signal path, responsive to said attenuation test signal for controlling said first and second RF relay modules, the signal generator and the RF microvoltmeter to individually measure the signal attenuation of each pin contact pair, responsive to said capacitance calibration signal for controlling said first RF relay modules and the capacitance meter to individually perform capacitance calibration measurements of each test signal path, responsive to said capacitance test signal for controlling said first RF relay modules and the capacitance meter to individually measure the capacitance of each pin contact pair, and responsive to said insulation resistance test signal for controlling said HV relay modules and the insulation resistance tester for measuring the insulation resistance of each pin contact pair.

2. An automated test system according to claim 1 further comprising display means responsive to test result signals provided by said signal processing means for displaying the results of attenuation, capacitance and insulation resistance tests.

3. An automated test system according to claim 2 wherein:

said signal processing means is further responsive to said connector type signal for determining which tests should be performed on the filter pin connector, and for sequentially providing instruction signals from a sequence of instruction signals to said display means, each instruction signal corresponding to a test procedure instruction from a sequence of test procedure instructions;

said display means being responsive to an instruction signal for displaying a test procedure instruction; and said signal processing means being responsive to an acknowledgement signal provided by said user interface for providing said display means with the next instruction signal in said sequence of instruction signals.

4. An automated test system according to claim 1 further comprising:

a plurality of first interchangeable adapter (IA) cables each having a unique end connector for interconnection with one end of a filter pin connector, each of said first IA cables providing a signal path from corresponding ones of said first RF relay modules and said HV relay modules to one pin contact in each pin contact pair; and a plurality of second IA cables each having a unique end connector for interconnection with the other end of a filter pin connector, each of said second IA cables providing a signal path from the other pin contact in each pin contact pair to corresponding ones of said second RF relay modules.

5. An automated test system for testing a filter pin connector having a shell and at least one pin contact pair, the test system having:

an insulation resistance tester for testing the insulation resistance between each pair of pin contact pairs and between the shell and each pin contact pair;

a capacitance meter for measuring the capacitance of each pin contact pair;

a signal generator; and a radio frequency (RF) microvoltmeter for measuring the pin contact pair attenuation of test signals provided by the signal generator, the system comprising:

a test fixture for providing a high voltage signal path between each pin contact pair and the insulation resistance tester, and for providing a RF signal path from the capacitance meter and the signal generator to the RF microvoltmeter between each pin contact pair, and signal processing means for controlling said test fixture, the insulation resistance tester, the capacitance meter, the signal generator and the RF microvoltmeter for measuring the insulation resistance, capacitance and signal attenuation of each pin contact pair.

6. An automated test system according to claim 5 wherein said test fixture comprises:

a first RF multiplexer having a plurality of first RF relay modules connected to the capacitance meter and the signal generator for providing a signal path from the capacitance meter and the signal generator to one pin contact in each pin contact pair;

a second RF multiplexer having a plurality of second RF relay modules connected to the RF microvoltmeter for providing a RF signal path from the other pin contact in each pin contact pair to the RF microvoltmeter;

a HV multiplexer having a plurality of HV relay modules connected to the HV insulation resistance tester for providing a HV signal path from the HV insulation resistance tester to the one pin contact in each pin contact pair.

7. An automated test system according to claim 6 wherein said test fixture further comprises:

a plurality of first interchangeable adapter (IA) cables each having a unique end connector for interconnection with one end of a filter pin connector, each of said first IA cables providing a signal path from corresponding ones of said first RF relay modules and said HV relay modules to one pin contact in each pin contact pair; and a plurality of second IA cables each having a unique end connector for interconnection with the other end of a filter pin connector, each of said second IA cables providing a signal path from the other pin contact in each pin contact pair to corresponding ones of said second RF relay modules.

8. An automated test system according to claim 5 further comprising:

a user interface means for providing a connector type signal indicative of the type of filter pin connector to be tested, for providing an attenuation calibration signal indicative of the test system being in a configuration for attenuation calibration, for providing an attenuation test signal indicative of the test system being in a configuration for performing attenuation testing of each pin contact pair, for providing a capacitance calibration signal indicative of the test system being in a configuration for capacitance calibration, for providing a capacitance test signal indicative of the test system being in a configuration for performing capacitance measurements of each pin contact pair, and for providing an insulation resistance test signal indicative of the test system being in a configuration for insulation resistance testing; and said signal processing means being responsive to said connector type signal for determining which ones of said first and second RF relay modules and said HV relay modules are required to provide a test signal path to each pin contact pair, responsive to said attenuation calibration signal for controlling said first and second RF relay modules, the signal generator and the RF microvoltmeter to individually perform attenuation calibration measurements of each test signal path, responsive to said attenuation test signal for controlling said first and second RF relay modules, the signal generator and the RF microvoltmeter to individually measure the signal attenuation of each pin contact pair, responsive to said capacitance calibration signal for controlling said first RF relay modules and the capacitance meter to individually perform capacitance calibration measurements of each test signal path, responsive to said capacitance test signal for controlling said first RF relay modules and the capacitance meter to individually measure the capacitance of each pin contact pair, and responsive to said insulation resistance test signal for controlling said HV relay modules and the insulation resistance tester for measuring the insulation resistance of each pin contact pair.

9. An automated test system according to claim 5 further comprising a display responsive to a test result signal provided by said signal processing means for displaying the results of attenuation, capacitance and insulation resistance tests.

10. An automated test system according to claim 9 further comprising:

a user interface for providing a connector type signal indicative of the type of filter pin connector to be tested;

said signal processing means being responsive to said connector type signal for determining which tests should be performed on the filter pin connector, and for sequentially providing instruction signals from a sequence of instruction signals to said display means, each instruction signal corresponding to a test procedure instruction from a sequence of test procedure instructions, said test procedure instructions containing text which instructs the user to alternatively configure the test system for calibration and for filter pin connector testing;

said display being responsive to an instruction signal for displaying the text of a test procedure instruction; and said signal processing means being responsive to an acknowledgement signal provided by said user interface, the acknowledgement signal being indicative of said test procedure instruction being carried out by a user, for performing test system calibration or filter pin connector testing, and for providing said display with the next instruction signal in said sequence of instruction signals.

11. A method of automatically testing a filter pin connector having a shell and at least one pin contact pair with a test system having:

an insulation resistance tester for testing the insulation resistance between each pair of pin contact pairs and between a connector shell and each pin contact pair;

a capacitance meter for measuring the capacitance of each pin contact pair;

a signal generator;

a radio frequency (RF) microvoltmeter for measuring the pin contact pair attenuation of test signals provided by the signal generator;
a high voltage signal path between each pin contact pair and the insulation resistance tester; and
an RF signal path from the capacitance meter and the signal generator to the RF microvoltmeter between each pin contact pair;
the method comprising the steps of:
selecting a filter pin connector to be tested;
determining the types of tests to perform on the selected filter pin connector; and
alternatively configuring the test system for calibration and filter pin connector testing.

12. A method of automatically testing a filter pin connector, according to claim 11, wherein said step of determining the types of test to perform on the selected filter pin connector is comprised of the steps of:
prompting a user for a specific input, indicative of the type of filter pin connector selected, by placing a question on a display; and
determining the response of the user by processing user input.

13. A method of automatically testing a filter pin connector, according to claim 11, wherein said step of alternatively configuring the test system for calibration and filter pin connector testing is comprised of the steps of:
prompting a user to alternatively configure the test system for calibration and filter pin connector testing by placing an instruction on a display;
prompting a user for a specific input indicative of the instruction being completed by placing a question on a display;
determining that the test system is configured for calibration or filter pin connector testing by processing user input; and
alternatively performing test system calibration and filter pin connector testing in response to determining that the test system is configured for calibration or filter pin connector testing.

* * * * *